United States Patent [19]

Kaneko

[11] Patent Number: 4,816,382

[45] Date of Patent: Mar. 28, 1989

[54] METHOD OF PRODUCING PLATE MAKING MASKS AND FILM FOR FORMING MASKS

[75] Inventor: Yujiro Kaneko, Tokyo, Japan

[73] Assignee: Fuji Photo Film Co., Ltd., Kanagawa, Japan

[21] Appl. No.: 81,389

[22] Filed: Aug. 4, 1987

[30] Foreign Application Priority Data

Aug. 4, 1986 [JP] Japan ............................... 61-181982

[51] Int. Cl.⁴ ................................................ G03C 5/00
[52] U.S. Cl. .......................................... 430/320; 430/5; 430/300; 430/394; 101/463.1
[58] Field of Search ............ 101/128.21, 128.4, 463.1, 101/468, 471; 430/4, 5, 49, 300, 330, 320, 394

[56] References Cited

U.S. PATENT DOCUMENTS

| | | | |
|---|---|---|---|
| 4,334,769 | 6/1982 | Fromson et al. | 430/156 |
| 4,351,238 | 9/1982 | Harpold | 101/128.21 |
| 4,351,685 | 9/1982 | Clark | 430/49 |
| 4,397,261 | 8/1983 | Jones | 101/128.21 |
| 4,434,198 | 2/1984 | Clark | 430/49 |
| 4,636,438 | 1/1987 | Hudson et al. | 430/5 |

*Primary Examiner*—George F. Lesmes
*Assistant Examiner*—Donald J. Loney
*Attorney, Agent, or Firm*—Sughrue, Mion, Zinn, Macpeak & Seas

[57] ABSTRACT

A method of producing plate machining masks in which a mask forming film having a support and a masking forming layer mostly transparent is put on a press-ready copy. Lines are cut through the mask forming layer in conformity to patterns observed therethrough on the press-ready copy. Encircled or encircling portions of the masks forming layer defined by the cut lines are peeled off. Either the mask forming layer has some color or reflectance properties and thus the remaining portions are used as a photographic mask over the press-ready copy or a paint is applied through the missing mask forming layer to the support and the remaining mask forming layer is removed to leave a paint-defined mask.

5 Claims, 2 Drawing Sheets

METHOD OF PRODUCING PLATE MAKING MASKS AND FILM FOR FORMING MASKS

BACKGROUND OF THE INVENTION

1. Field of the Invention

The present invention generally relates to a method of producing plate making masks and a mask forming film. It particularly relates to a method of producing plate making masks useful in multicolor printing or the like in the field of direct plate making. It further relates to a mask forming film suitable for producing the masks.

2. Background of the Invention

A technique for producing a printing plate by utilizing an electrophotographic process or a silver salt diffusion transfer process is being popularized because of the simplicity of the technique. The popularization of the technique causes an increase in the requests for the production of multicolor printed matter or printed matter in which tone is partially designated through such a direct plate making process as described above. In this case, to cope with the color separation or screening in accordance with the designation, it is necessary to produce masks for covering designated portions of a press-ready copy.

For example, when dichromatic printing is performed, the following plate making process has been employed for a press-ready copy having a simple pattern. According to the process generally used, white paper is cut so as to form a mask for covering a portion of the press-ready copy unnecessary for the first color. An electrophotographic printing plate is exposed to light reflected from the masked press-ready copy and is then developed to obtain a printing plate for the first color. Next, similarly to this, another portion of the press-ready copy unnecessary for the second color is covered with another mask similarly prepared. Another electrophotographic printing plate is exposed to light reflected from the masked press-ready copy and then developed to obtain another printing plate for the second color.

In the case where it is necessary to perform color separation in fine detail, on the other hand, the following plate making process has been employed. In this process, a press-ready copy is duplicated so that the thus obtained first and second press-ready copies are used respectively for the first and second colors. In each of the press-ready copies, an unnecessary portion is painted out with a white correction liquid or the like. Next, printing plates for the two colors are made of electrophotographic printing plates by using the two prepared press-ready copies.

In such conventional processes, however, there have been disadvantages in the following points. That is, the conventional process employing masks prepared by cutting white paper can be applied only to the case of a press-ready copy having a simple pattern. In making the covering masks, errors are apt to be caused between the first and second colors when mask-covered portions are formed. In the latter process in which color separation has to be made in fine detail, on the other hand, cost and time are taken for duplication of a press-ready copy, and the painting with a white correction liquid is a time-consuming work and may cause errors in printing. Moreover, it is difficult to carry out those conventional processes in the case where complicated color separation or screening for designated portions is performed. These disadvantages have limited the range of utilization of the direct plate making process.

SUMMARY OF THE INVENTION

It is therefore an object of the present invention to eliminate the foregoing disadvantages in the prior art.

It is another object of the present invention to provide a method for accurately, rapidly and easily producing masks for accurately covering a press-ready copy in a plate making process for producing a printing plate through reflection exposure from the press-ready copy.

It is a further object of the present invention to provide a mask forming film suitable for producing masks for a press-ready copy.

The above objects should be obtained in a method of producing masks for covering a press-ready copy used in a plate making process for producing a printing plate through an exposure with light reflected from the press-ready copy.

In order to attain the above objects, according to an aspect of the present invention, the method comprises the steps of putting a mask forming film on the press-ready copy. The mask forming film has a support and a mask forming layer formed on the support so as to be removable from the support. A cutting line is formed in the mask forming layer at a portion corresponding to a designated portion of the press-ready copy while the press-ready copy is observed through the mask forming film. The portion of the mask forming layer encircled by the cutting line is separated from the remainder portion of the mask forming layer by being stripped off.

According to another respect of the present invention, the mask forming film comprises a support, a mask forming layer formed on the support so as to be removable, and a cover film formed on the mask forming layer so as to be removable.

The feature of the method of producing plate making masks according to the present invention resides in making two mask portions at one time of forming a cutting line, that is, a portion encircled by the cutting line and the remainder portion which is not encircled by the cutting line. This can be attained as follows. A mask forming film is put on a press-ready copy. The mask forming film has a support and a mask forming layer formed on the support. The mask forming layer can be removable from the support. The cutting line is formed in a necessary portion of the mask forming film by a knife or the like while the press-ready copy is observed through the mask forming film put thereon. The portion of the mask forming layer encircled by the cutting line is removed from the remainder portion of the mask forming layer by peeling off the portion of the mask forming layer, to thereby form a first mask.

The feature of the mask forming film according to the present invention resides in that the mask forming film comprises a support and at least a mask forming layer formed on the support so as to be removable.

BRIEF DESCRIPTION OF THE DRAWINGS

The above objects, features, and advantages of the present invention will be apparent from the following detailed description taken in conjunction with the accompanying drawings, in which.

DETAILED DESCRIPTION OF THE INVENTION

Figure 1:
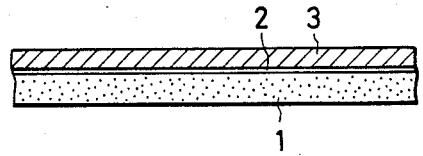
FIG. 1 is a cross section showing an embodiment of the mask forming film according to the present invention.

A first aspect of the present invention is a method of producing plate making masks by using a mask forming film having a mask forming layer formed on a support so as to be removable from the support. In the mask forming film of this type, the mask forming layer is made to stick on the support by an intermediate adhesive layer.

The support of the mask forming film according to the present invention is required to have sufficient strength and flatness for supporting the mask forming layer and to have sufficient transparency (permeability) for making it possible to observe a press-ready copy through the support. Further, it is desirable that the support has sufficient hardness so that the support is not readily injured when a cutting line is slit through the mask forming layer. Specifically, the support may be a plastic film formed of, for example, polyester represented by polyethylene terephthalate (PET), cellulose ester, polyolefin, polyvinyl chloride, polycarbonate, or the like. Preferably, the thickness of the support is selected to be 50 μm to 200 μm.

The mask forming layer of the mask forming film according to the present invention is required to have sufficient transparency (permeability) for making it possible to observe a press-ready copy through the mask forming layer and the support. Further, in order to use the mask forming layer as a mask, the mask forming layer is required to have such a reflective property that the mask forming layer reflects photographic illuminating light when a press-ready copy is photographically exposed onto a printing plate so that substantially no picture outlines are formed in the printing plate. Alternatively, the mask forming layer should have such a characteristic that the foregoing reflective property can be given to the mask forming layer after a cutting line has been provided in the mask forming layer. Further, it is desirable that the mask forming layer have such a property that a cutting line can be easily and accurately formed by a knife or the like.

In the case where the mask forming layer is used as it is as a mask after the mask forming layer has been removed, the mask forming layer is required to have a self-supporting property by itself.

In the case of the mask forming layer of the type inherently having the foregoing reflective property, paper, plastic film, or the like may be used as the material of the mask forming layer. In the case of using paper as the material, generally, it is preferable to select the unit weight thereof to be about 30 g/m$^2$ to 100 g/m$^2$. Although white paper is suitable, colored paper may be used. In the case of using a plastic film as the material, it is preferable to use a film formed of resin, such as polyester, cellulose ester, polyolefin, polyvinyl chloride, or the like, added with white pigment, for example, titanium diode, or a film made opaque by foaming or matting its surface. Also in this case, a white film is suitable. However, a colored film may be used if necessary.

On the other hand, in the case of the mask forming layer of the type in which the foregoing reflective property is given after a cutting line has been formed in the mask forming layer, polyester, cellulose ester, polyolefin, polyvinyl chloride, polycarbonate, or the like, may be used as the material of the mask forming layer. Preferably, the thickness of the mask forming layer is selected to be about 10 μm to 100 μm.

The adhesive layer provided between the support and the mask forming layer may be formed of any adhesive so long as the adhesive layer has such a property that the support and the mask forming layer can be kept integrally with each other and the mask forming layer can be removed from the support if necessary. The material of the adhesive layer may be desirably selected in accordance with the kind and property of the elements to be bonded to each other. Generally, an acrylic adhesive, a synthetic rubber adhesive, or the like, is used as the material of the adhesive layer.

Next, a description will be made as to the method of producing plate making masks by using the foregoing mask forming film having the mask forming layer provided on the support through the adhesive layer.

First, by using a knife, a cutter or the like, a cutting line is made in a portion of the mask forming layer corresponding to a designated portion of a press-ready copy, that is, a portion necessary to perform color separation or screening. The operator performs the cutting while observing the press-ready copy through the mask forming film. In this case, it is necessary to make the cutting line sufficiently deep so that the portion of the mask forming layer corresponding to the designated portion can be separated from the remaining portion. However, the cutting line must not be made so deep that the cutting line penetrates through the support.

In the case where the mask forming layer already has the foregoing reflective property in this stage, the portion of the mask forming layer surrounding the portion encircled by the cutting line is removed while leaving the portion encircled by the cutting line on the support. Thus, a mask for the designated portion and another mask for the portion than the designated portion are formed at the same time.

In the case where the mask forming layer is not yet provided with the reflective property in this stage, on the contrary, the portion of the mask forming layer encircled by the cutting line is removed from the support. Then, the previously described reflective property is supplied to the whole surface of the mask forming film and to the surface portion of the support exposed by the removal of the mask forming layer portion. For example, white paint is uniformly applied. Thereafter, the remaining portion of the mask forming layer is stripped from the support. Thus, a mask (formed on the support with white paint) for the designated portion and another mask for the portion other than the designated portion are produced at the same time.

In another aspect of the present invention, there are used a mask forming film having a support, a removable mask forming layer, and a removable cover film. The mask forming layer and the cover film is formed in this order on the support. The mask forming film of this type has such an arrangement that the mask forming layer is bonded to the support through an adhesive layer and the cover film is bonded on top of the mask forming layer with another adhesive layer.

To the support, the adhesive layer (provided between the support and the mask forming layer), and the mask forming layer in the mask forming film of the kind described above, the support, the adhesive layer, and the mask forming layer of the type having the foregoing reflective property in advance of the mask forming film as described as to the foregoing embodiment can be applied respectively.

The cover film is used to protect the adhesive layer as well as the mask forming layer disposed under the cover film. Preferably, the cover film has suitable flexibility and thickness for making it possible to easily and accurately perform a cutting operation when a cutting line is cut in the mask forming layer. Specifically, a relatively flexible plastic film formed of, for example, polyester, polyvinyl chloride, or cellulose acetate, is useful. Preferably, the thickness of the cover film is selected to be about 5 $\mu$m to 80 $\mu$m. The cover film is generally selected to be transparent, however, it may be semitransparent to the extent that the picture outlines in a press-ready copy can be discriminated through the mask forming layer. Alternatively, the cover film may be colored.

The adhesive layer provided between the mask forming layer and the cover film may be formed of any adhesive so long as the adhesive layer has such a property that the support and the mask forming layer can be kept integrally bonded with each other and the mask forming layer can be removed from the support if necessary. The material of the adhesive layer may be desirably selected in accordance with the kind and property of the elements to be bonded to each other. Generally, the adhesive described above for the foregoing adhesive layer between the support and the mask forming layer is applicable to this adhesive layer.

In the mask forming film of this type, it is desirable to make the adhesive force between the support and the mask forming layer relatively smaller than that between the mask forming layer and the cover film. The reason is that a mask corresponding to the designated portion in the press-ready copy can be easily produced in such a manner that the portion of the mask forming layer encircled by the cutting line is stuck onto another film after the cover film covering the encircled portion has been removed and then the portion encircled by the cutting line is stripped from the support.

Next, the method will be described of producing masks by using such a mask forming film, as described above, having a mask forming layer provided on a support through an adhesive layer and a cover film provided on the mask forming layer through another adhesive layer.

First, the mask forming film is put on a press-ready copy, a cutting line is formed, through the cover film, by using a cutter or the like, in a portion of the mask forming layer corresponding to a designated portion of the press-ready copy. That is, a portion necessary to perform screening or color separation, while observing the press-ready copy through the mask forming film. In this case, it is necessary to make the cutting line sufficiently deep so that the portion of the mask forming layer corresponding to the designated portion can be separated from the remaining portion. However, the cutting line must not be made so deep that the cutting line penetrates through the support.

Next, a portion of the cover film encircled by the cutting line is stripped off, and another suitable film (hereinafter, referred to as a reception film), for example, such a plastic film as used as the support of the mask forming film, is put in place on the mask forming film. The portion of the mask forming layer encircled by the cutting line and exposed by the stripped cover film is pressed so as to be sufficiently stuck to the reception film. Thereafter, the reception film is separated from the mask forming layer so that the portion of the mask forming layer encircled by the cutting line moves onto the reception film while leaving the other portion of the mask forming the portion of the mask layer surrounding the removed portion on the support. Thus, a mask for the designated portion and another mask for the portion other than the designated portion are produced at the same time.

Of the foregoing embodiments, the embodiment employing such a mask forming film provided with a mask forming layer and a cover film formed in this order removably on a support is particularly preferable. This is because multiple necessary masks can be produced at the same time by use of the mask forming film of the type described above even in the case where separation of three colors or more is performed or in the case where a portion encircled by a cutting line exists within a range of a portion encircled by another cutting line.

Further, the mask forming film of the type described above can be used in the case where masks are produced in such a manner that a picture in an original is formed through an exposure with light reflected from the original during printing, copying, or the like. That is, the mask forming film can be used, for example, in the step of forming color-separated press-ready copies from an original press-ready copy by using the silver salt diffusion transfer process or in the step of forming color-separated negative films from an original press-ready copy by exposing a lithographic film or the like to light form the original press-ready copy. Moreover, the mask forming film of this type can be utilized in the case of producing color-separated masks used for multicolor copying by utilizing an electrostatic photographic process.

In the method of producing plate making masks according to the present invention, the mask forming film is put on a press-ready copy, and a cutting line is formed in a portion of a mask forming layer of the mask forming film corresponding to a designated portion of the press-ready copy while observing the press-ready copy through the mask forming film. Therefore, even when complicated color separation is performed, the cutting line can be formed easily correctly and accurately with no error in position of the cutting line.

Because painting, sticking, or the like, is not directly performed on to a press-ready copy unlike the conventional method, it is not necessary to duplicate a press-ready copy. The one press-ready copy suffices even in the case where the press-ready copy has a complicated pattern. Further, according to the present invention, a portion of the mask forming layer encircled by a cutting line and a portion surrounding of the encircled portion are separated from each other so as to be used as a separate mask. Thus, color separating masks can be produced at the same time.

Referring to the accompanying drawings, examples according to the present invention will be described hereunder.

Example 1

FIG. 1 is a cross section showing an embodiment of the mask forming film according to the present invention. FIG. 2 is a diagram successively showing the steps of the method of producing plate making masks using the mask forming film of FIG. 1. The press-ready copy and the mask forming film are illustrated in plan and in cross section at left and right sides respectively in each of the steps (a) to ($g_2$) in the drawing.

In FIG. 1, a transparent film of polyethylene terephthalate having thickness of 100 μm is used as a support 1. A commercially available acrylic adhesive is used as an adhesive layer 2. A transparent film of polyethylene terephthalate having a thickness of 75 μm to be used as a mask forming layer 3 is juxtaposed to the support 1 with the adhesive layer coated therebetween. The three layer structure is pressed to thereby form a mask forming film.

Referring to FIG. 2, the method will be described step by step of producing plate making masks for a press-ready copy used for an electrophotographic printing plate, by use of the foregoing mask forming film.

The diagrams of (a) to (f) in FIG. 2 show the process of the method of producing masks in the order of the steps of the method. Diagrams ($g_1$) and ($g_2$) of FIG. 2 show the states where the masks are used. In each of the diagrams (a) to ($g_2$), a plan and a cross section are shown at the left and right side respectively.

Figure 2A:
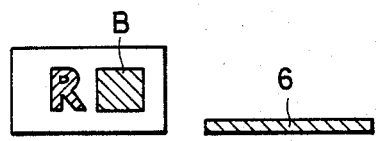
FIG. 2 is a diagram successively showing the steps of the method of producing plate making masks using the mask forming film of FIG. 1, the press-ready copy and the mask forming film being illustrated in plan and in cross section at left and right sides respectively in each of the steps (a) to (g$_2$) in the drawings.

FIG. 2(a) shows an example of a press-ready copy 6, in which patterns R and B are designated red and blue screening portions respectively.

Figure 2B:
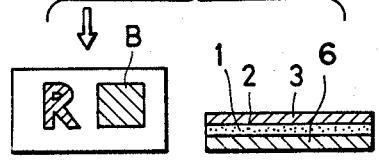

FIG. 2(b) shows a state where the mask forming film of FIG. 1 is put on the press-ready copy 6. The patterns of the press ready copy 6 can be observed through the support 1 and the mask forming layer 3.

Figure 2C:
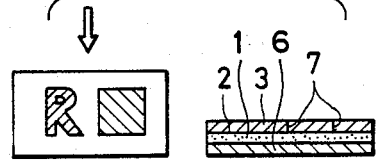
Figure 2D:
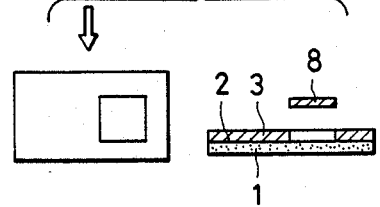

In the step of FIG. 2(c), a cutter cuts cutting lines 7 in the mask forming layer 3 at a position corresponding to the area of the screen portion B. Then, the press-ready copy 6 is separated from the mask forming film. A portion 8 of the mask forming layer 3 encircled by the cutting line 7 is stripped from the support 1 as shown in FIG. 2(d).

Figure 2E:
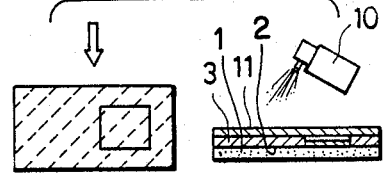
Figure 2F:
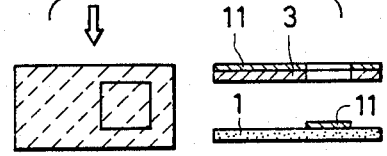
Figure 2F:
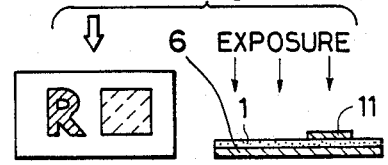
Figure 2F:
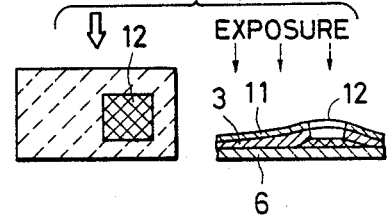

As shown in FIG. 2(e), a commercially available aerosol white spray paint (a lacquer) 10 is sprayed on the mask forming film to thereby apply the white paint onto the mask forming film as a paint layer 11 to make the whole surface thereof white. After being dried, the remaining mask forming layer 3 is removed from the support 1 so that two plate making masks can be made at the same time as shown in FIG. 2(f).

FIG. 2($g_1$) shows the state in which the mask formed of the support 1 of the mask forming film is put on the press-ready copy 6 and then subjected to exposure. FIG. 2($g_2$) shows the state in which a flat screen 12 is put on the same press-ready copy 6 corresponding to the designated screening portion and then the mask formed on the mask forming layer 3 is put on the flat screen 12 and subjected to an exposure. In this case, the flat screen 12 is not required to accurately coincide with the shape of the designated portion but is required only to cover the designated portion. Thus, according to the present invention, it is not necessary to produce two press-ready copies, but exposure work can be carried out by using one and the same press-ready copy.

Example 2

Figure 3:
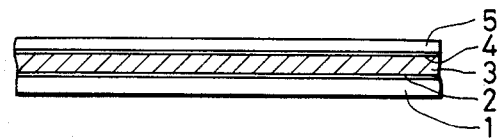
FIG. 3 is a cross section showing another embodiment of the mask forming film according to the present invention.

FIG. 3 is a cross section showing another embodiment of the mask forming film according to the present invention. FIG. 4 is a diagram successively showing the steps of the method of producing plate making masks using the masks forming film of FIG. 3. The press-ready copy and the mask forming film are illustrated in plan and in cross section at the left and right sides respectively in each of the steps (a) to ($g_2$) in the drawing.

In FIG. 3, a transparent film of polyethylene terephthalate having a thickness of 100 μm is used as a support 1. An acrylic available on the market is used as an adhesive layer 2. Printing paper having a unit weight of 65 g/m² is used as a mask forming layer 3. An acrylic adhesive available on the market is used as an adhesive layer 4 applied between the mask forming layer 3 and a cover film 5. A transparent film of polyethylene terephthalate having a thickness of 50 μm is used as the cover film 5. These layers 1 through 5 were put one on another in this order and stuck by pressure to thereby produce a mask forming film.

Referring to FIG. 4, the method of producing plate making masks for a press-ready copy used for an electrophotographic printing plate, by use of the foregoing mask forming film, will be described step by step.

The diagrams of (a) to (f) in FIG. 4 show the process of the method of producing masks in the order of the steps thereof, and the diagrams of ($g_1$) and ($g_2$) of FIG. 4 show the states where the masks are used. In each of the diagrams (a) to ($g_2$), a plan and a cross section are shown at left and right side respectively.

Figure 4A:
FIG. 4 is a diagram successively showing the steps of the method of producing plate making masks using the mask forming film of FIG. 3, the press-ready copy and the mask forming film being illustrated in plan and in cross section at left and right sides respectively in each of the steps (a) to (g$_2$) in the drawing.

FIG. 4(a) shows an example of a press-ready copy 6, in which patterns R and B are a red and a blue portion respectively.

Figure 4B:
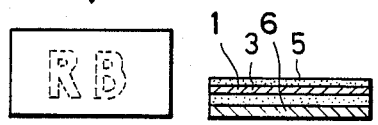

FIG. 4(b) shows a state where the mask forming film of FIG. 3 is put on the press-ready copy 6. The patterns of the press-ready copy 6 can be observed through the mask forming film constituted by the support 1, the mask forming layer 3, and the cover film 5.

Figure 4C:
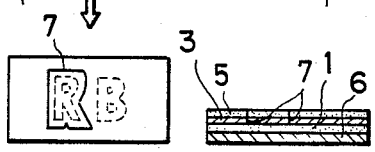
Figure 4D:
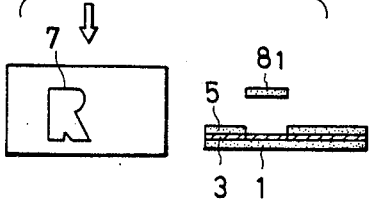

In the step of FIG. 4(c), a cutting line 7 is formed by a cutter in a portion of the mask forming layer 3 corresponding to the red portion R. It is of course clear that the same cutting line 7 extends through the cover film 5. Thereafter, the press-ready copy 6 is separated form the mask forming film. Only a portion $8_1$ of the cover film 5 encircled by the cutting line 7 is stripped as shown in FIG. 4(d).

Figure 4E:
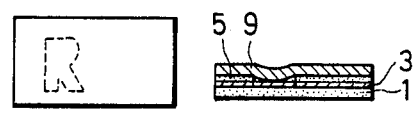

As shown in FIG. 4(e), a reception film 9 made of the same material having the same thickness as those of the support 1 is put on the mask forming film. A portion $8_2$ of the mask forming layer 3 encircled by the cutting line 7, which is exposed by the removal of the portion $8_1$ of the cover film 5, is stuck onto the reception film 9 with pressure.

Figure 4F:
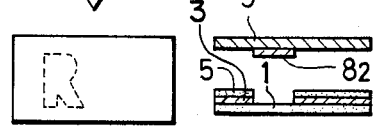
Figure 4F:
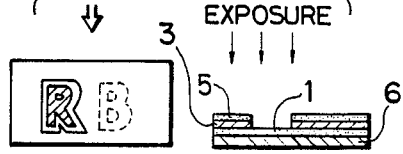
Figure 4F:
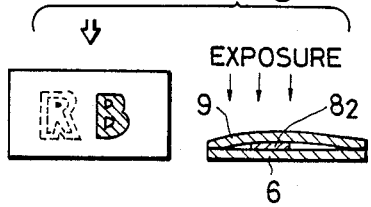

As shown in FIG. 4(f), when the reception film 9 is separated from the mask forming film, the portion $8_2$ of the mask forming layer 3 encircled by the cutting line 7 is separated from the portion of the mask forming layer 3 surrounding the portion $8_2$ under the condition that the portion $8_2$ is stuck on the reception film 9.

FIG. 4($g_1$) shows the state in which the mask formed on the support 1 is put on the press-ready copy 6 and subjected to an exposure. FIG. 4($g_2$) shows the state in which the mask formed on the reception film 9 is put on the press-ready copy 6 and subjected to an exposure. In both the states, one and the same press-ready copy is used.

Although the examples of two-color separation have been described in the embodiments according to the present invention, also in the case where separation of three colors or more is performed, masks for the respective colors can be produced from a single mask forming film by repetition of the steps of providing a cutting line in the masks forming layer, removing the cover film, and sticking the mask forming layer onto the reception film with pressure.

According to the present invention, the mask forming film having a removable mask forming layer formed on a support is put on a press-ready copy, a cutting line is provided in a portion of the mask forming layer corresponding to a designated portion of the press-ready copy while observing the press-ready copy through the mask forming film, and a portion encircled by the cutting line is separated from the remainder portion by stripping. Therefore, complicated color separation or screening of a press-ready copy which is difficult to be performed in the prior art can be carried out by using only one press-ready copy. Further, masks can be easily accurately produced in a short time, and generation of errors in working of masks is reduced. Therefore, multicolor printed matter or printed matter having tone partially designated can be easily printed through the direct plate making process such as the electrophotographic process or the like, so that the range of use of the direct plate making process can be considerably extended.

What is claimed is:

1. A method of producing masks for covering a press-ready copy used in a plate-making process for producing a printing plate through an exposure with reflection light from said press-ready copy, said method comprising the steps of:
   putting a mask forming film on said press-ready copy, said mask forming film having a support and a removable mask forming layer formed on said support;
   forming a cutting line in said mask forming layer at a portion corresponding to a designated portion of said press-ready copy while observing said press-ready copy through said mask forming film;
   separating said mask-forming film from said press-ready copy;
   separating a cutting line portion of said mask forming layer defined by said cutting line from a remaining portion of said mask forming layer by peeling off said cutting line portion of said mask forming layer to form a first mask, and adhering said cutting line portion to a film to form a second mask;
   overlaying said first mask on said press-ready copy;
   illuminating said press-ready copy overlaid with said first mask to effect photographic exposure;
   overlaying said second mask on said press-ready copy; and
   illuminating said press-ready copy overlaid with said second mask to effect photographic exposure.

2. A method as recited in claim 1, wherein said mask forming layer has sufficient transparency to observe said press-ready copy through said mask forming layer and said support, and said mask forming layer has a reflective property to reflect the photographic illuminating light during said illuminating of said press-ready copy.

3. A method as recited in claim 1, wherein said mask forming film further includes a cover film covering said mask forming film, wherein said forming step cuts said cutting line through said cover film, said forming step further comprising removing a portion of said cover film defined by said cutting line.

4. A method as recited in claim 1, further comprising between said second separating step and said first overlaying step the steps of:
   applying a non-transparent coating to said first mask; and
   removing remaining portions of said mask forming layer from said first mask.

5. A method recited in claim 1, wherein said support of said mask forming film is transparent.

* * * * *